US006650206B2

United States Patent
Nakamura et al.

(10) Patent No.: US 6,650,206 B2
(45) Date of Patent: Nov. 18, 2003

(54) SURFACE ACOUSTIC WAVE FILTER AND COMMUNICATION APPARATUS WITH THE SAME

(75) Inventors: Hiroyuki Nakamura, Katano (JP); Toru Yamada, Katano (JP); Shigeru Tsuzuki, Neyagawa (JP); Kazunori Nishimura, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 16 days.

(21) Appl. No.: 09/951,658

(22) Filed: Sep. 13, 2001

(65) Prior Publication Data

US 2002/0057035 A1 May 16, 2002

(30) Foreign Application Priority Data

Sep. 13, 2000 (JP) .......................... 2000-277793

(51) Int. Cl.[7] .............................. H03H 9/64; H03H 9/72
(52) U.S. Cl. ..................... 333/193; 333/133; 310/313 B
(58) Field of Search .................. 333/193–196, 333/133; 310/313 R, 313 B, 313 C, 313 D

(56) References Cited

U.S. PATENT DOCUMENTS

| | | | | |
|---|---|---|---|---|
| 4,296,391 A | * | 10/1981 | Hazama et al. ............. | 333/193 |
| 4,396,851 A | * | 8/1983 | Kishimoto et al. ..... | 310/313 B |
| 5,666,092 A | * | 9/1997 | Yamamoto et al. ......... | 333/194 |
| 6,075,426 A | * | 6/2000 | Tsutsumi et al. ........... | 333/193 |
| 6,104,260 A | * | 8/2000 | Yamada et al. ............. | 333/193 |
| 6,313,717 B1 | * | 11/2001 | Dufilie et al. ............... | 333/193 |
| 6,462,633 B1 | * | 10/2002 | Ichikawa ..................... | 333/193 |
| 6,469,598 B2 | * | 10/2002 | Tsuzuki et al. ............. | 333/193 |
| 6,476,691 B1 | * | 11/2002 | Tsuzuki et al. ............. | 333/193 |

FOREIGN PATENT DOCUMENTS

| | | | |
|---|---|---|---|
| EP | 1104100 | | 5/2001 |
| EP | 1 104 952 | * | 6/2001 |
| GB | 1 512 790 | | 8/1975 |
| JP | 2000-91869 | | 3/2000 |
| JP | 2000-077974 | | 3/2000 |
| JP | 2001-053581 | | 2/2001 |
| WO | WO 00/76067 | * | 12/2000 |

OTHER PUBLICATIONS

Harimann and Abbott, "Overview of Design Challenges for Single Phase Unidirectional Saw Filters", 1989 IEEE Ultrasonics Symposium, pp. 79–89.

P. Ventura et al., "A New Concept in SPUDT Design: the RSPUDT (Resonant SPUDT", 1994 *Ultrasonic Symposium, IEEE*, pp. 1–6, 1994.

* cited by examiner

*Primary Examiner*—Barbara Summons
(74) *Attorney, Agent, or Firm*—RatnerPrestia

(57) ABSTRACT

A surface acoustic wave filter, has:
- a piezoelectric substrate; and
- a at least two filter tracks having at least an input interdigital transducer electrode and an output interdigital transducer electrode provided on said piezoelectric substrate,
- wherein the respective input interdigital transducer electrodes of said at least two filter tracks are brought into connection in parallel;
- the respective output interdigital transducer electrodes of said at least two filter tracks are brought into connection in parallel, and
- overlapping widths of electrode fingers of said input interdigital transducer electrode and output interdigital transducer electrode are different from each other for each of said at least two filter tracks.

17 Claims, 11 Drawing Sheets

SURFACE ACOUSTIC WAVE FILTER AND COMMUNICATION APPARATUS WITH THE SAME

BACKGROUND OF THE INVENTION

1. Field of the Invention

The present invention relates to a surface acoustic wave filter and a communication apparatus using this.

2. Related Art of the Invention

In recent years, progress in information communication field has given rise to increase in information amount to be transmitted. Accompanied thereby, a surface acoustic wave filter that is excellent in phase linearity for a comparatively wide band range and within a passband, and conventionally, a surface acoustic wave filter of transversal type was suitable as such a surface acoustic wave filter. On the other hand, as well known, since a surface acoustic wave filter of transversal type gives rise to a large insertion loss, as technology to enhance low insertion loss, a surface acoustic wave filter of transversal type with a unidirectional electrode being utilized is being expected and considered.

A conventional surface acoustic wave filter of transversal type with a unidirectional electrode being utilized will be described below.

FIG. 10(*a*) is a drawing showing a conventional surface acoustic wave filter of transversal type with a unidirectional electrode being utilized. Reference numeral 1001 denotes a piezoelectric substrate, and a surface acoustic wave filter is constructed by forming an input and output interdigital transducer electrode (referred to as IDT electrode hereinafter) on the piezoelectric substrate 1001 and disposing the input IDT electrode 1002 and the output IDT electrode 1003 at a predetermined distance. The input IDT electrode 1002 as well as the output IDT electrode 1003 includes a first as well as a second unidirectional electrodes 1004 and 1005 according to a prior art disclosed in the IEEE Ultrasonics symposium, 1989, PP. 77–89. Incidentally the entire disclosure of above document are incorporated herein by reference in its entirely.

FIG. 10(*b*) shows an enlarged view of the first unidirectional electrode 1004. As a basic construction, a basic unit is constructed by one λ/4-width electrode finger 1004*a* with a quarter width of a wavelength λ of a surface acoustic wave propagating on the piezoelectric substrate 1001 and two λ/8-width electrode fingers 1004*b*, totaling three electrode fingers. In addition, the second unidirectional electrode 1005 and the unidirectional electrode 1004 are symmetrical. The unidirectional electrode of such type is called EWC-SPUDT (Electrode Width Controlled Single-Phase Unidirectional Transducer), and has been conventionally used as technology of lowering insertion loss.

For the surface acoustic wave filter constructed as described above, frequency characteristics of a filter are determined by thinning out electrode fingers of the input IDT electrode 1002 and the output IDT electrode 1003 and giving various kinds of weighing. In the prior arts, thus, flat filter characteristics within the passband for a wide band range and attenuation amount that is steep in the vicinity of the passband are realized.

In addition, in Japanese Patent Laid-Open No. 2000-77974 specification, a surface acoustic wave filter having a first and second channel on a piezoelectric substrate is disclosed. In FIG. 11, a schematic construction view of a surface acoustic wave filter having a first and a second channel according to a prior art is shown. The above described two-channel filter has two channels of a first channel 1102 and a second channel 1103 each having an input IDT electrode 1102*a*, 1103*a* and an output IDT electrode 1102*b*, 1103*b* provided on a piezoelectric substrate 1101. Such a surface acoustic wave filter is constructed to have phase characteristics on the first channel 1102 and the second channel 1103 of being in phase in the passband and in opposite phase each other the stopband. Incidentally the entire disclosure of above document are incorporated herein by reference in its entirely.

In recent years, enhancement in compactness and lightness on a portable terminal is progressed and accompanied thereby, enhancement in compactness of a surface acoustic wave filter is being demanded. However, if a steep attenuation amount in the vicinity of a passband is tried to be given in the above described surface acoustic wave filter of transversal type as shown in FIG. 10, a sufficient weighting onto the input/output IDT electrode will become necessary to make the length IDT electrode longer, giving rise to a problem that enhancement in compactness is difficult.

In addition, the surface acoustic wave of two-channel filter construction as shown in FIG. 11 has sharp band range characteristics and enables a compact surface acoustic wave filter to be provided, presenting, however, a problem that it lacks flatness within a passband.

SUMMARY OF THE INVENTION

Accordingly, the present invention has an object to provide a surface acoustic wave filter being compact, having wide passband and having steep attenuation characteristics in the vicinity of passband as well as a flat characteristics within the passband.

To achieve the object mentioned above, one aspect of the present invention is a surface acoustic wave filter, comprising:

a piezoelectric substrate; and at least two filter tracks having at least an input interdigital transducer electrode and an output interdigital transducer electrode provided on said piezoelectric substrate, wherein the respective input interdigital transducer electrodes of said at least two filter tracks are brought into connection in parallel;

the respective output interdigital transducer electrodes of said at least two filter tracks are brought into connection in parallel, and overlapping widths of electrode fingers of said input interdigital transducer electrode and output interdigital transducer electrode are different from each other for each of said at least two filter tracks.

Another aspect of the present invention is the surface acoustic wave filter, wherein said filter tracks are two filter tracks of a first filter track and a second filter track, the input interdigital transducer electrodes of said first and second filter tracks are brought into connection in parallel, the output interdigital transducer electrodes of said first and second filter tracks are brought into connection in parallel, and overlapping width of the electrode fingers of the said input interdigital transducer electrode and output interdigital transducer electrode in said first filter track and overlapping width of the electrode fingers of the said input interdigital transducer electrode and output interdigital transducer electrode in said second filter track are different from each other.

Still another aspect of the present invention is the surface acoustic wave filter, wherein said first filter track and said second filter track have different weighting functions.

Yet still another aspect of the present invention is the surface acoustic wave filter, wherein a phase relationship between said first filter track and said second filter track is substantially in-phase within a passband, and is substantially in opposite phase outside the passband, and center frequencies of said first and second filter tracks are substantially the same.

Still yet another aspect of the present invention is the surface acoustic wave filter, wherein said first filter track has a transmission characteristic of having two peaks within the passband, said second filter track has a transmission characteristic of having one peak within the passband; and an amplitude characteristic of said first filter track and said second filter track is that frequencies of values lower by substantially 3 dB than a value of a maximum attenuation amount are substantially the same.

A further aspect of the present invention is the surface acoustic wave filter, wherein with the overlapping width of said first filter track being W1 and the overlapping width of said second filter track being W2, a relationship of $0.8 \leq W1/W2 \leq 0.95$ is fulfilled.

A still further aspect of the present invention is the surface acoustic wave filter, wherein at least one of said input interdigital transducer electrode and/or output interdigital transducer electrode includes a unidirectional electrode.

A yet further aspect of the present invention is the surface acoustic wave filter, wherein said unidirectional electrode includes two kinds, that is, a first unidirectional electrode to intensify surface acoustic waves in a predetermined direction and a second unidirectional electrode to intensify surface acoustic waves in the direction opposite to said predetermined direction.

A still yet further aspect of the present invention is the surface acoustic wave filter, wherein parallel connection of said input interdigital transducer electrodes of said filter track is configured by connecting adjacent electrode fingers with each other, and parallel connection of said output interdigital transducer electrodes of said filter track is configured by connecting adjacent electrode fingers with each other.

An additional aspect of the present invention is a surface acoustic wave filter, comprising:

a piezoelectric substrate; and at least one filter track having an input interdigital transducer electrode and an output interdigital transducer electrode provided on said piezoelectric substrate, wherein said input interdigital transducer electrode and/or said output interdigital transducer electrode include a first unidirectional electrode to intensify surface acoustic waves in one direction and a second unidirectional electrode to intensify surface acoustic waves in the direction opposite to said one direction.

A still additional aspect of the present invention is the surface acoustic wave filter, wherein said first and second unidirectional electrodes have four electrode fingers in one wavelength, said four electrode fingers have two electrode finger pairs, and said electrode finger pairs have electrode fingers having different widths, and an electrode width ratio (L2/L1) between a width (L2) of thick electrode finger and width (L1) of thin electrode finger is larger than 1.

A yet additional aspect of the present invention is the surface acoustic wave filter, wherein, in said electrode finger pair, with a distance between said thin electrode finger and said thick electrode finger being γ;

with a distance between said thick electrode finger and the left end of a region covering said input interdigital transducer electrode and/or said output interdigital transducer electrode sectioned by a half-wavelength unit being α; and with a distance between said thin electrode finger and the right end of a region covering said input interdigital transducer electrode and/or said output interdigital transducer electrode sectioned by a half-wavelength unit being β, relationships of γ>α+β and α<β are given.

A still yet additional aspect of the present invention is the surface acoustic wave filter, wherein said electrode width ratio (L2/L1) in said electrode finger pair falls within a range of $1.4 \leq (L2/L1) \leq 3.6$.

A supplementary aspect of the present invention is the surface acoustic wave filter, wherein positions of said thin electrode finger and said thick electrode finger of said first unidirectional electrode are opposite from positions of said thin electrode finger and said thick electrode finger of said second unidirectional electrode.

A still supplementary aspect of the present invention is the surface acoustic wave filter, wherein said piezoelectric substrate is 28° to 42° rotating Y cut quartz substrate.

A yet supplementary aspect of the present invention is a communication apparatus, comprising:

the surface acoustic wave filter;

transmission means of carrying out transmission; and reception means of carrying out reception.

BRIEF DESCRIPTION OF THE DRAWINGS

FIG. 2(*b*) is a graph showing phase characteristics of a first and a second filter tracks 102 in FIG. 1;

FIG. 10(*b*) is an enlarged view of the first unidirectional electrode 1004.

DESCRIPTION OF SYMBOLS

Figure 1:
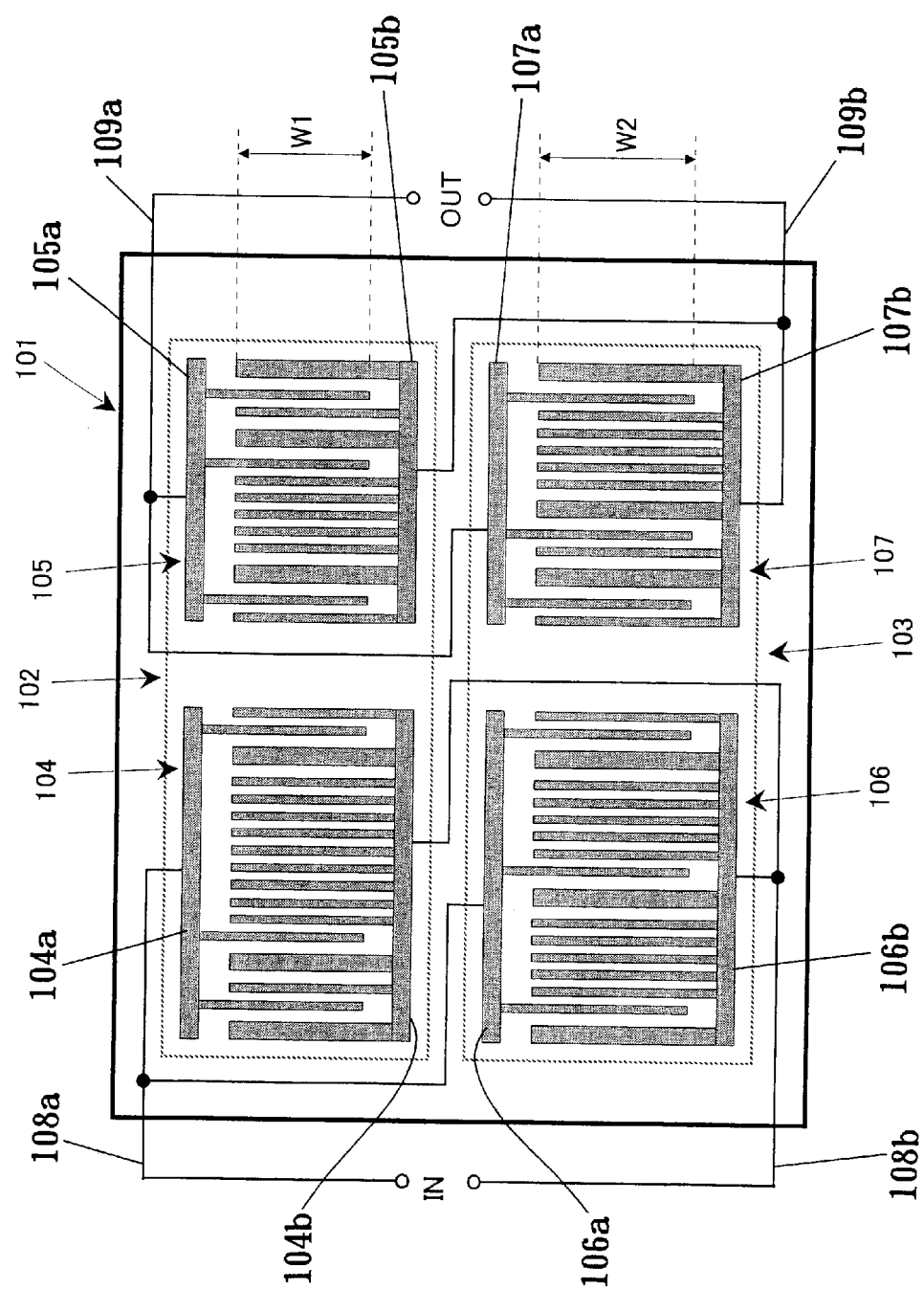
FIG. 1 is a construction view of a surface acoustic wave filter of a first embodiment in the present invention.

101, 301, 501, 901, 1001 Piezoelectric substrate
102, 302, 502, 902 First filter track 103, 303, 503, 903 Second filter track
104, 304, 504, 904 Input IDT electrode of first filter track
105, 305, 505, 905 Output IDT electrode of first filter track
106, 306, 506, 906 Input IDT electrode of second filter track
107, 307, 507, 907 Output IDT electrode of second filter track
201 Amplitude characteristics of a first filter track
202 Amplitude characteristics of a second filter track
203 Phase characteristics of a first filter track
204 Phase characteristics of a second filter track
401, 601 First region
402, 602 Second region
403, 603 Third region
604 First electrode finger pair
604a Thin electrode finger of a first electrode finger pair 604
604b Thick electrode finger of a first electrode finger pair 604
605 Second electrode finger pair
605a Thin electrode finger of a second electrode finger pair 605
605b Thick electrode finger of a second electrode finger pair 605
606 Upside bus bar electrode
607 Downside bus bar electrode
608 $\lambda/2$ cell including first electrode finger pair 604
609 $\lambda/2$ cell including first electrode finger pair 605
401a 402a, 403a $\lambda/4$ width electrode finger
401b, 402c, 402b, 403b, 403c $\lambda/8$ width electrode finger
1002 Input IDT electrode
1003 Output IDT electrode
1004 First unidirectional electrode
1005 Second unidirectional electrode
Preferred Embodiments of the Invention Embodiments of a surface acoustic wave filter of the present invention will be described below with reference to the drawings.

(First Embodiment)

FIG. 1 shows a surface acoustic wave filter of a first embodiment of the present invention. In FIG. 1, reference numeral 101 denotes apiezoelectric substrate, and a first filter track 102 and a second filter track 103 are constructed in parallel on the piezoelectric substrate 101. The first filter track 102 is constructed of an input IDT electrode 104 and an output IDT electrode 105 being disposed at a predetermined distance. Likewise,a second filter track 103 is constructed of an input IDT electrode 106 and an output IDT electrode 107 being disposed at a predetermined distance.

In the input IDT electrode 104, the electrode fingers on one side of the opposing electrode fingers are connected in common to a bus bar electrode 104a and the electrode fingers on the other side of the opposing electrode fingers are connected to a bus bar electrode 104b. Moreover, in the output IDT electrode 105, the electrode fingers on one side of the opposing electrode fingers are connected in common to a bus bar electrode 105a and the electrode fingers on the other side of the opposing electrode fingers are connected to a bus bar electrode 105b.

Likewise, in the input IDT electrode 106, the electrode fingers on one side of the opposing electrode fingers are connected in common to a bus bar electrode 106a and the electrode fingers on the other side of the opposing electrode fingers are connected to a bus bar electrode 106b. Moreover, in the output IDT electrode 107, the electrode fingers on one side of the opposing electrode fingers are connected in common to a bus bar electrode 107a and the electrode fingers on the other side of the opposing electrode fingers are connected to a bus bar electrode 107b.

In addition, the bus bar electrodes 104a and 106a are connected to a common input line 108a while the bus bar electrodes 104b and 106b are connected to a common input line 108b.

On the other hand, the bus bar electrodes 105a and 107a are connected to a common output line 109a while the bus bar electrodes 105b and 107b are connected to a common output line 109b.

In addition, the input and output IDT electrodes 104, 105, 106 and 107 are constructed of unidirectional electrodes being included. That is, regions being constructed of one $\lambda/4$-width electrode finger with $\frac{1}{4}$-width and two $\lambda/8$-width electrode fingers totaling 3 electrode fingers when the input and output IDT electrodes 104, 105, 106 and 107 are sectioned with a wavelength $\lambda$ of a surface acoustic wave are provided. Here, the input IDT electrodes 104 and 106 are constructed to have directionality in the right direction and the output IDT electrodes 105 and 107 are constructed to have directionality in the left direction.

Moreover, the first and the second filter tracks 102 and 103 are provided with respectively different weighting.

In addition, the center frequencies of the first and the second filter tracks 102 and 103 are practically in accord. Moreover, the input IDT electrode 104 of the first filter track 102 and the input IDT electrode 106 of the second filter track 103 are brought into connection in parallel. Likewise, the output IDT electrode 105 of the second filter track 103 and the output IDT electrode 107 of the second filter track 103 are brought into connection in parallel. Moreover, an overlapping width W1 of the first filter track 102 and an overlapping width W2 of the second filter track 103 are constructed of different sizes. Here, an overlapping width refers to a length of overlap of electrode fingers activating surface acoustic waves in an IDT electrode.

With respect to a surface acoustic wave filter being constructed as described above, operation thereof will be described below.

Figure 2:
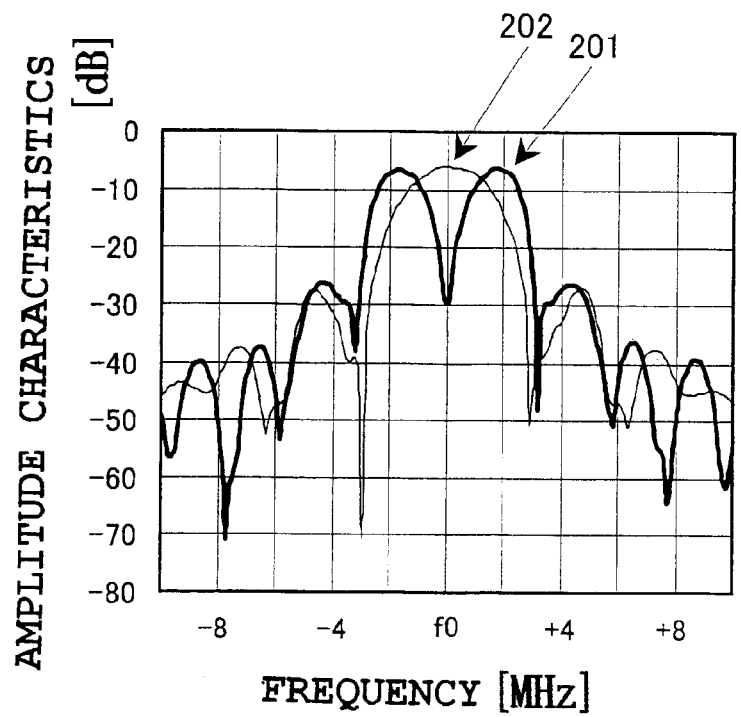
FIG. 2(*a*) is a graph showing amplitude characteristics of a first and a second filter tracks 102 in FIG. 1.
Figure 2:
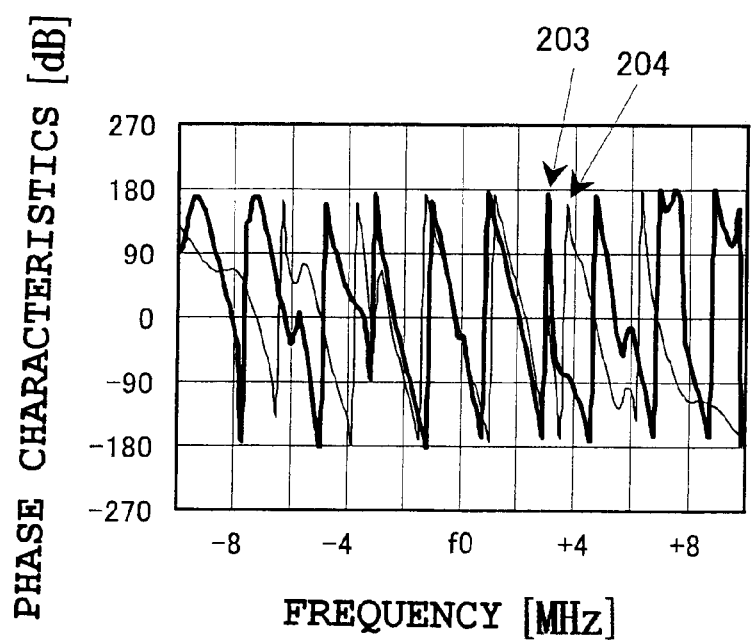

FIG. 2(a) shows an amplitude characteristic 201 of the first filter track 102 and an amplitude characteristic 202 of the second filter track 103 in FIG. 1 while FIG. 2(b) shows a phase characteristic 203 of the first filter track 102 and a phase characteristic 204 of the second filter track 103 in FIG. 1.

In the present embodiment, the center frequencies of the first and the second filter tracks 102 and 103 are substantially the same. Moreover, as for a passband, as shown in FIG. 2(a), the amplitude characteristic 201 of the first filter track 102 has two peaks, and a wide passband characteristic, but has a large insertion loss in the vicinity of the center frequency.

On the other hand, the amplitude characteristic 202 of the second filter track 103 has a peak in the vicinity of the center frequency has a low insertion loss, but the passband is narrow. In addition, as shown in FIG. 2(b), the phase difference in passband of the first filter track 102 and the second filter track 103 are approximately 0°, that is, the phases are substantially the same. Incidentally, the words "the phases are substantially the same"quoted here refer to phase difference within a range of −50° to +50°, preferably −20° to +20°.

On the other hand, as for outside the passband, as shown in FIG. 2(a), the amplitude characteristic 201 of the first filter track 102 and the amplitude characteristic 202 of the second filter track 103 don't have spurious suppression outside the passband, but have substantially the same level of spurious.

In addition, as shown in FIG. 2(b), the phase difference between the phase characteristic 203 of the first filter track 102 and the phase characteristic 204 of the second filter track 103 is substantially 180°, that is, the phases are opposite. Here, the phase difference of substantially 180° means a range of 130° to 230°, and preferably is supposed to phase difference of a range of 160° to 200°.

Accordingly, in the present embodiment, spurious levels of the first filter track 102 and the second filter track 103 are approximately equal outside the passband, and the phases are substantially opposite, and therefore, the spuriousness between the first filter track 102 and the second filter track 103 cancel each other and as a result thereof, large attenuation is given.

Moreover, in the present embodiment, the overlapping width W1 of the first filter track 102 and the overlapping width W2 of the second filter track 103 is set to different lengths, and thereby the amplitude characteristics of the first and the second filter tracks within the passband are adjusted, and frequencies of values lower by 3dB from the maximum attenuation amount of respective filter tracks can be approximately the same, thus making flat and wide passband realizable.

As described above, according to a surface acoustic wave filter of the present embodiment, compared with the case where surface acoustic wave filters having equal filter characteristics are formed with prior arts, the input/output IDT electrode length can be reduced, thereby enabling significant downsizing of a surface acoustic wave filter.

Moreover, the surface acoustic wave filter of the present embodiment has a wide pass band, secures a steep attenuation amount outside the passband, and can realize flatness within the passband.

In addition, the surface acoustic wave filter of the present embodiment has the first and the second filter tracks brought into connection in parallel, and therefore can keep the input/output impedance lower than that of the conventional surface acoustic wave filter, and can take impedance matching with devices brought into connection with the previous stage and the poststage of the surface acoustic wave filter easier. Mounting the surface acoustic wave filter of the present invention onto a communication apparatus having transmission means and reception means can provide a communication apparatus with higher performance.

(Second Embodiment)

Figure 3:
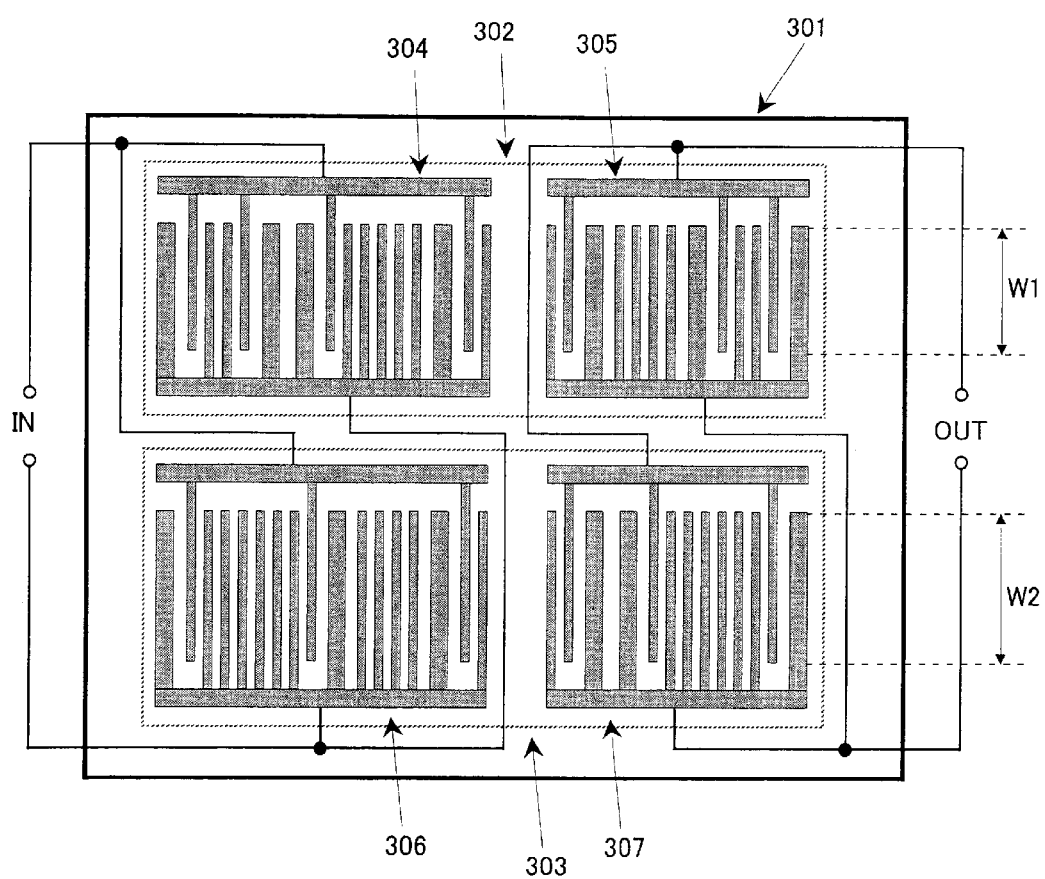
FIG. 3 is a construction view of a surface acoustic wave filter of a second embodiment in the present invention.

FIG. 3 shows a surface acoustic wave filter of a second embodiment of the present invention. In FIG. 3, reference numeral 301 denotes a piezoelectric substrate, and a first filter track 302 and a second filter track 303 are constructed in parallel on the piezoelectric substrate 301. The first filter track 302 is constructed of an input IDT electrode 304 and an output IDT electrode 305 being disposed at a predetermined distance. Likewise, a second filter track 303 is constructed of an input IDT electrode 306 and an output IDT electrode 307 being disposed at a predetermined distance.

Incidentally, a construction of bus bar electrodes are the same as that of first embodiment, and detailed description is omitted.

Here, the input/output IDT electrodes 304, 305, 306 and 307 are formed by electrode construction called R-SPUDT. For this electrode construction, as in the first embodiment, regions being constructed of one $\lambda/4$-width electrode finger with ¼-width and two 80/8-width electrode fingers totaling 3 electrode fingers when the input and output IDT electrodes 304, 305, 306 and 307 are sectioned with a wavelength $\lambda$ of a surface acoustic wave are provided.

Figure 4:
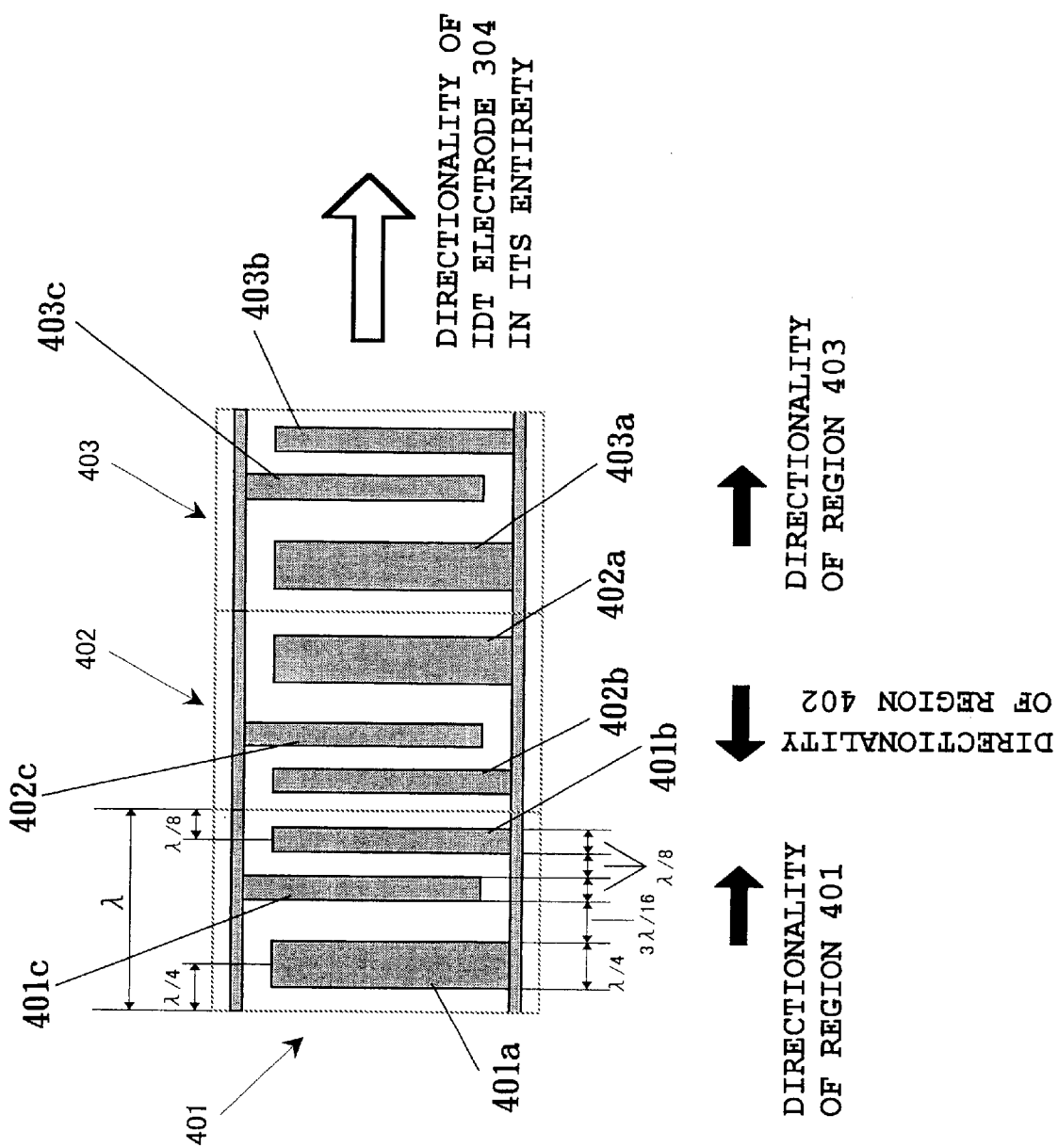
FIG. 4 is a drawing showing a region of unidirectional electrodes constructing an input IDT electrode in FIG. 3.

A region of unidirectional electrode in construction of the input IDT electrode 304 in the present embodiment is shown in FIG. 4. The first region 401 is constructed of a $\lambda/4$-width electrode finger 401a, a $\lambda/8$-width electrode finger 401b being provided in the same side as the $\lambda/4$-width electrode finger 401a, and a $\lambda/8$-width electrode finger 401c being provided in the side facing the $\lambda/4$-width electrode finger 401a.

In addition, the second region 402 is constructed of a $\lambda/4$-width electrode finger 402a, a $\lambda/8$-width electrode finger 402b being provided in the same side as the $\lambda/4$-width electrode finger 402a, and a $\lambda/8$-width electrode finger 402c being provided in the side facing the $\lambda/4$-width electrode finger 402a.

In addition, the third region 403 is constructed of a $\lambda/4$-width electrode finger 403a, a $\lambda/8$-width electrode finger 403b being provided in the same side as the ?/4-width electrode finger 403a, and a $\lambda/8$-width electrode finger 403c being provided in the side facing the $\lambda/4$-width electrode finger 403a.

In addition, in the drawing, arrows indicate directionalities respectively of a first region 401, a second region 402, a third region 403 and directionality of the entire IDT electrode. A rightward unidirectionality is given to the first and the third regions 401 and 403 while an opposite unidirectionality, that is, in the leftward direction, is given to the second region 402. This takes place because in the region 401 and the region 403, the disposition of the $\lambda/4$-width electrode finger and the disposition of the $\lambda/8$-width electrode finger are made similar, but the disposition of the $\lambda/4$-width electrode finger 402a and the $\lambda/8$-width electrode finger 402b in the region 402 are opposite from the disposition of the $\lambda/4$-width electrode fingers 401a and 403a as well as the $\lambda/8$-width electrode fingers 401b and 403b in the regions 401 and 403.

Moreover, the input IDT electrode 304 in its entirety is constructed to have the rightward directionality. The recursive SPUDT will be constructed to form resonance cavity within the IDT electrode by giving a part of region the opposite directionality against the other region within one IDT electrode.

As for other input and output IDT electrodes 305, 306 and 307, they are unidirectional with construction similar to those as the above described input IDT electrode 304, but in respective filter tracks 302 and 303, directionality of the input IDT electrode 304 as well as the output IDT electrode 305 and the input IDT electrode 306 as well as the output IDT electrode 307 is constructed to face each other. In addition, amplitude characteristics, phase characteristics and center frequency relationship of the first and the second filter tracks 302 and 303 are the same as those in the first embodiment.

Moreover, in the present embodiment, the overlapping width W1 of the first filter track 302 and the overlapping width W2 of the second filter track 303 are set to different lengths, and thereby the amplitude characteristics of the first and the second filter tracks within the passband are adjusted, and frequencies of values lower by 3 dB from the maximum attenuation amount of respective filter tracks can be constructed so as to be approximately the same, thereby making flat and wide passband realizable.

As described above, according to the surface acoustic wave filter of the present embodiment, compared with the first embodiment, the IDT electrode length will be able to be made further shorter, and it will become possible to enhance compactness on sizes of a surface acoustic wave filter much more. Moreover, the surface acoustic wave filter of the present embodiment has a wide pass band, secures a steep attenuation amount outside the passband, and can realize flatness within the passband.

In addition, the surface acoustic wave filter of the present embodiment has the first and the second filter tracks being brought into connection in parallel, and therefore can keep the input/output impedance lower than that of the conventional surface acoustic wave filter, and can take impedance matching with devices brought into connection with the previous stage and the poststage of the surface acoustic wave filter easier. Mounting the surface acoustic wave filter of the present invention onto a communication apparatus having transmission means and reception means can provide a communication apparatus with higher performance.

(Third Embodiment)

Figure 5:
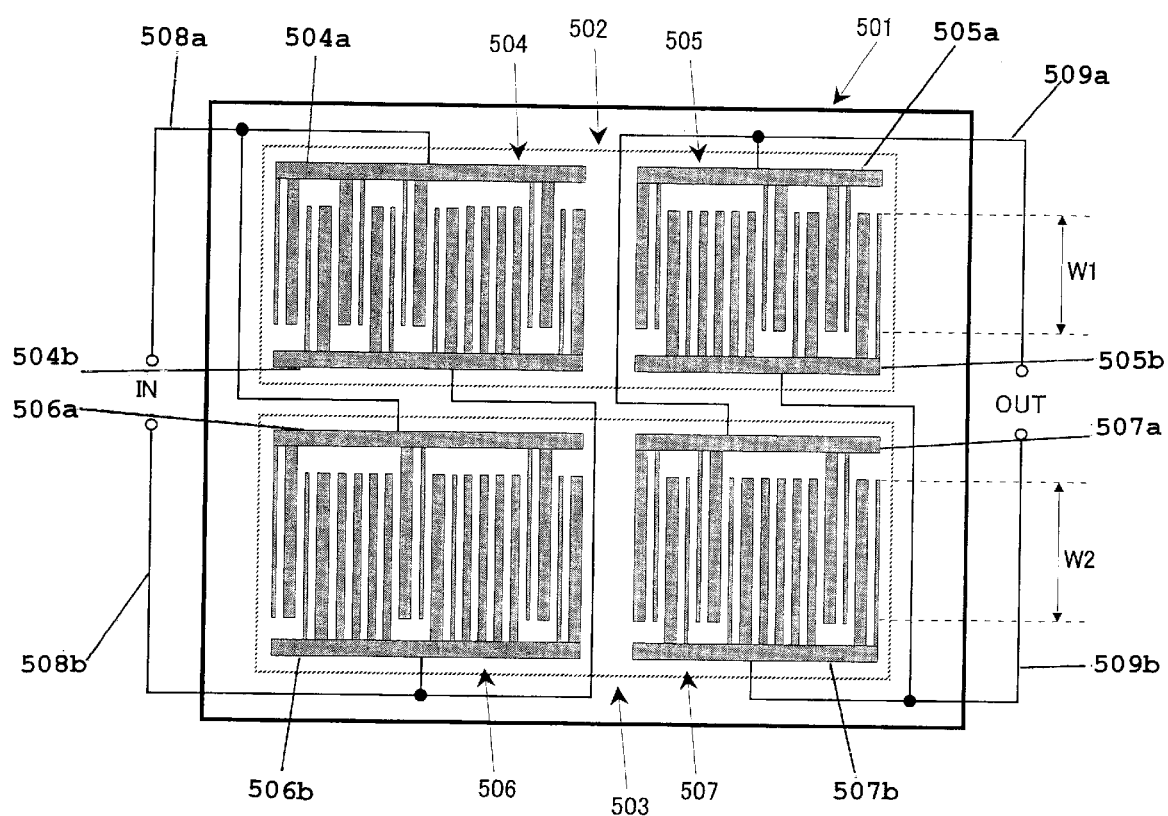
FIG. 5 is a construction view of a surface acoustic wave filter of a third embodiment in the present invention.

FIG. 5 shows a surface acoustic wave filter of a third embodiment of the present invention. The difference between the present embodiment and the second embodiment is, as shown in FIG. 5, that the electrode finger per wavelength for the input as well as the output IDT electrodes 504, 505, 506 and 507 of the first and the second filter tracks 502 and 503 giving directionality is constructed of four pieces. For this, in the second embodiment, as shown in FIG. 4, directionality is given by three electrode fingers per wavelength.

In addition, in the input IDT electrode 504, the electrode fingers on one side of the opposing electrode fingers are connected in common to a bus bar electrode 504a and the electrode fingers on the other side of the opposing electrode fingers are connected to a bus bar electrode 504b. Moreover, in the output IDT electrode 505, the electrode fingers on one side of the opposing electrode fingers are connected in common to a bus bar electrode 505a and the electrode fingers on the other side of the opposing electrode fingers are connected to a bus bar electrode 505b.

Likewise, in the input IDT electrode 506, the electrode fingers on one side of the opposing electrode fingers are connected in common to a bus bar electrode 506a and the electrode fingers on the other side of the opposing electrode fingers are connected to a bus bar electrode 506b. Moreover, in the output IDT electrode 507, the electrode fingers on one side of the opposing electrode fingers are connected in common to a bus bar electrode 507a and the electrode fingers on the other side of the opposing electrode fingers are connected to a bus bar electrode 507b.

In addition, the bus bar electrodes 504a and 506a are connected to a common input line 508a while the bus bar electrodes 504b and 506b are connected to a common input line 508b.

On the other hand, the bus bar electrodes 505a and 507a are connected to a common output line 509a while the bus bar electrodes 505b and 507b are connected to a common output line 509b.

Figure 6:
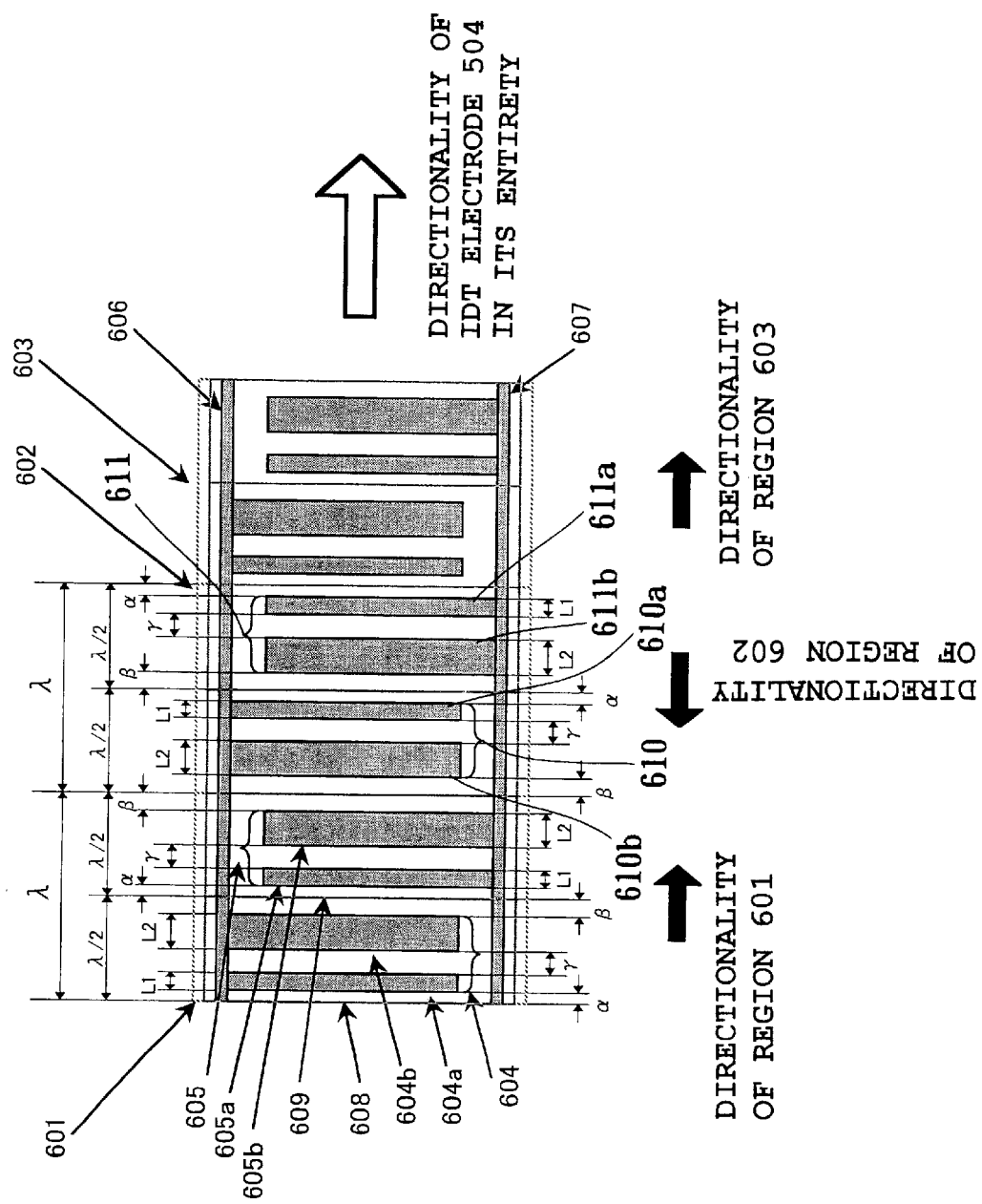
FIG. 6 is a drawing showing a region of unidirectional electrodes constructing an input IDT electrode in FIG. 5.

A region of unidirectional electrode in construction of the input IDT electrode 504 in the present embodiment is shown in FIG. 6. In FIG. 6, solid arrows respectively indicate directionalities of respective regions of the first region 601, the second region 602 and the third region 603, and an outline arrow indicates directionality of the IDT electrode 504 in its entirety.

In FIG. 6, the first region 601 has, within a λ, two electrode finger pairs of a first electrode finger pair 604 and a second electrode finger pair 605, and the first electrode finger pair 604 is constructed of a thin electrode finger 604a and a thick electrode finger 604b. In addition, the second electrode finger pair 605 is constructed of a thin electrode finger 605a and a thick electrode finger 605b.

The first electrode finger pair 604 is brought into connection with an upside bus bar electrode 606 and the second electrode finger pair 605 is brought into connection with the downside bus bar electrode 607, and the first electrode finger pair 604 and the second electrode finger pair 605 are constructed to overlap with each other, and in this first region 601, the surface acoustic wave has directionality in the direction to head for the thick electrode finger from the thin electrode finger, that is, the rightward directionality.

In addition, the second region 602 has, within a λ, has two electrode finger pairs of a first electrode finger pair 610 and a second electrode finger pair 611, and the first electrode finger pair 610 is constructed of a thin electrode finger 610a and a thick electrode finger 610b. In addition, the second electrode finger pair 611 is constructed of a thin electrode finger 611a and a thick electrode finger 611b.

The first electrode finger pair 610 is brought into connection with an upside bus bar electrode 606 and the second electrode finger pair 611 is brought into connection with the downside bus bar electrode 607, and the first electrode finger pair 604 and the second electrode finger pair 605 are constructed to overlap with each other.

That is, the second region 602 has a reversed construction of the first region 601 in terms of positions of the thin electrode and the thick electrode in the first as well as the second electrode finger pairs 604 and 605, and in the second region 602, the surface acoustic wave has directionality in the direction to head for the thick electrode finger from the thin electrode finger, that is, the leftward directionality.

In addition, the third region 603 is constructed similar to the first region 601.

A rightward unidirectionality is given to the first and the third regions 601 and 603 while an opposite unidirectionality, that is, in the leftward direction, is given to the second region 602. This takes place because in the region 601 and the region 603, the disposition of the first and the second electrode fingers are made similar, but in the first and the second electrode finger pairs in the region 602 the positions of the thin electrode and the thick electrode are opposite from the regions 601 and 603.

Moreover, the input IDT electrode 604 in its entirety is constructed to have the right ward directionality. The recursive SPUDT will be constructed to form resonance cavity within the IDT electrode by giving a part of region the opposite directionality against the other region within one IDT electrode.

As for other input and output IDT electrodes 505, 506 and 507, they are unidirectional with construction similar to those as the above described input IDT electrode 504, but in respective filter tracks 502 and 503, directionality of the input IDT electrode 504 as well as the output IDT electrode 505 and the input IDT electrode 506 as well as the output IDT electrode 507 is to face each other.

Moreover, in FIG. 6, with electrode finger width of the thin electrode fingers 604a and 605a being L1 and with electrode finger width of the thick electrode finger 604b and 605b being L2, characteristics of unidirectional electrode depends on electrode width ratio L2/L1 being a ratio of the width of thick electrode finger to the width of thin electrode finger. In the present embodiment, a change in this electrode width ratio serves to make directionality of the IDT electrode and excitation ratios of the surface acoustic wave controllable. At this time, L2/L1 shall be larger than 1 and preferably fall within a range of 1.4 to 3.6. Thus, optimizing L2/L1, it will become possible to control directionality and activation efficiency of surface acoustic wave and improve the insertion loss of the surface acoustic wave filter.

Moreover, with the gap between the thin electrode finger 604a and the thick electrode finger 604b as well as the gap between the thin electrode finger 605a and the thick electrode finger 605b being γ, with the gap between the thin electrode finger 604a and the left end of the λ/2 region 608 including the first electrode finger pair 604 and the gap between the thin electrode finger 605a and the left end of the λ/2 cell 609 including the second electrode finger pair 605 being α in consideration of the λ/2 region given by bisecting the first region 601 in the propagating direction of the surface acoustic wave, and with the gap between the thick electrode finger 604b and the right end of the λ/2 cell 608 including the first electrode finger pair 604 and the gap between the thick electrode finger 605b and the right end of the λ/2 cell 609 including the first electrode finger pair 605 being β, γ is larger than α+β and the relationship of α<β is fulfilled. Fulfilling α<β will give rise to excellent symmetry, enabling to make deviation within the passband small and make attenuation amount outside the passband large.

Incidentally, the optimum values of α and β change corresponding with the electrode width ratio (L2/L1) and the film thickness ratio (h/λ), but with γ being larger than α+β, the relationship α<β is the same irrespective of the electrode width ratio (L2/L1) and the film thickness ratio (h/λ).

Moreover, in the present embodiment, the overlapping width W1 of the first filter track 602 and the overlapping width W2 of the second filter track 603 is set to different lengths, and thereby the amplitude characteristics of the first and the second filter tracks within the passband are adjusted, and frequencies of values lower by 3 dB from the maximum attenuation amount of respective filter tracks are constructed to be approximately the same, thereby making flat and wide passband realizable.

FIG. 7(a) is a graph showing the characteristics of the surface acoustic wave filter of the third embodiment shown in FIG. 5. The vertical axis has been standardized with the minimum insertion loss. Here, as a substrate, a 37° rotating Y cut quartz substrate isused. In addition, with the film thickness of the electrode being h, the film thickness ratio is h/λ=1.8%, and the electrode width ratio is set to L2/L1=1.75 being within the optimum range. In addition, with α=0.757× (λ/16) and β=0.873×(λ/16), γ is made larger than α+β and the relationship is made to fulfill α<β. Moreover, as concerns overlapping widths, the overlapping width of the first filter track 502 is set to W1=18λ, and the overlapping width of the second filter track 503 is set to W2=20λ.

Figure 8:
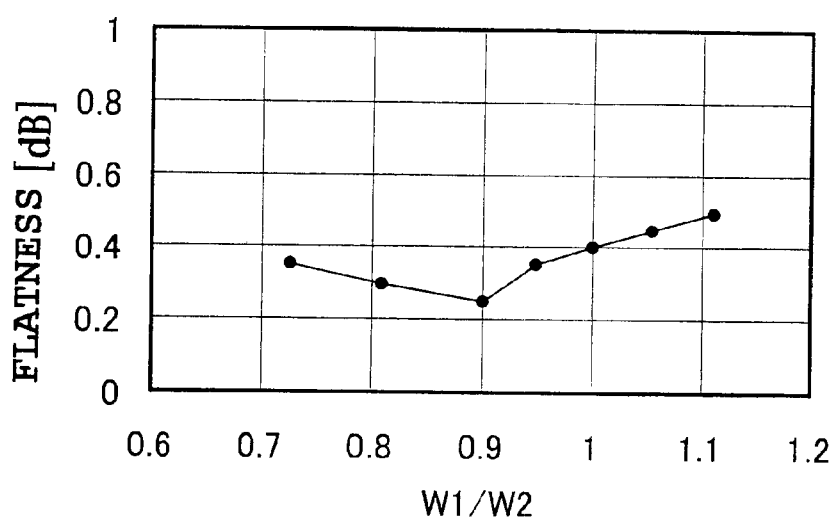
FIG. 8 is a graph showing relationship between W1/W2 and flatness.

In addition, for the purpose of comparison, characteristics of surface acoustic wave filter with the overlapping width of the first and the second filter tracks being made same (W1=W2=19λ) are shown in FIG. 8. Making the overlapping widths of the first filter track and the second filter track different from each other, it is understood that the flatness within the band range has been improved from 0.4 dB to 0.25 dB. Moreover, it is understood that the surface acoustic wave filter of the present embodiment has a wide passband and is excellent in attenuation characteristics in the vicinity of the passband.

In addition, what is shown in FIG. 7(c) is the filter characteristics in the case where the overlapping width of the first filter track 502 is set to W1=16λ and the overlapping width of the second filter track 503 is set to W2=22λ. Also in this case, the flatness is improved to 0.35 dB, but the band range width of the filter is made thin. On the contrary, as shown in FIG. 7(d), in the case where the overlapping width of the first filter track 502 is set to W1=20λ and the overlapping width of the second filter track 503 is set to W2=18k, the flatness is deteriorated to 0.5 dB.

Figure 7:
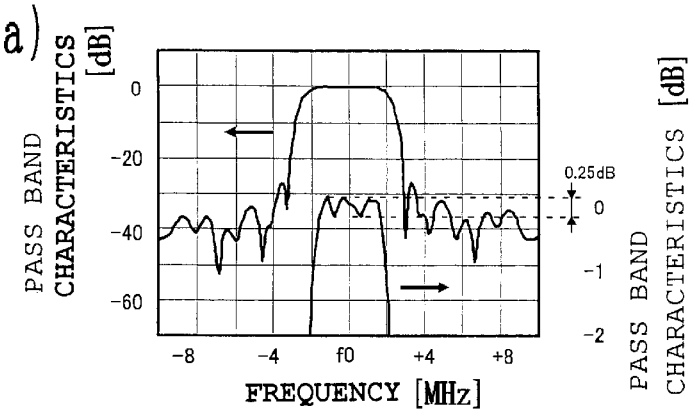
FIGS. 7(*a*)–7(*d*) are graphs showing pass characteristics of the surface acoustic wave filter in FIG. 5.
Figure 7:
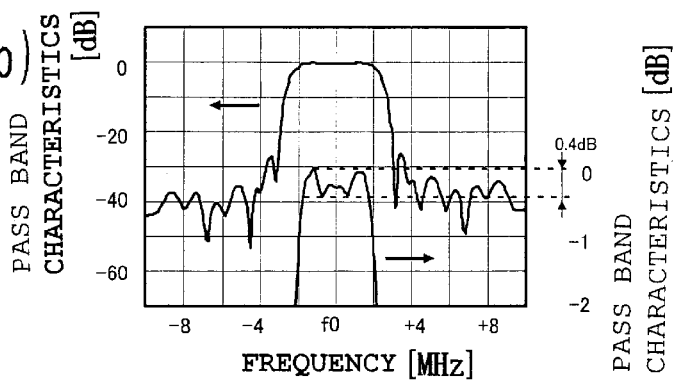
Figure 7:
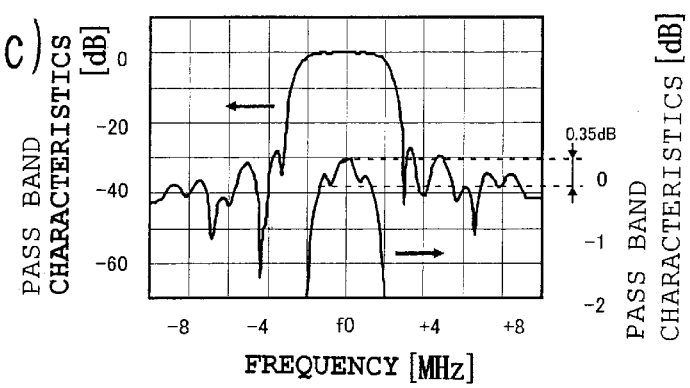
Figure 7:
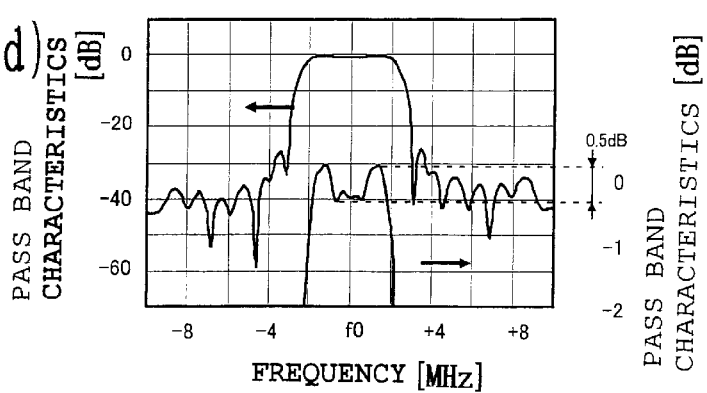

FIG. 8 is a graph showing the relationship between the overlapping width of the first and the second tracks and flatness. The longitudinal axis is expressed with the ratio of W1/W2. With reference to FIG. 7 and FIG. 8, taking improvement in flatness and compression in band range width, the condition $0.8 \leq W1/W2 \leq 0.95$ is effective for improvement in flatness.

Figure 9:
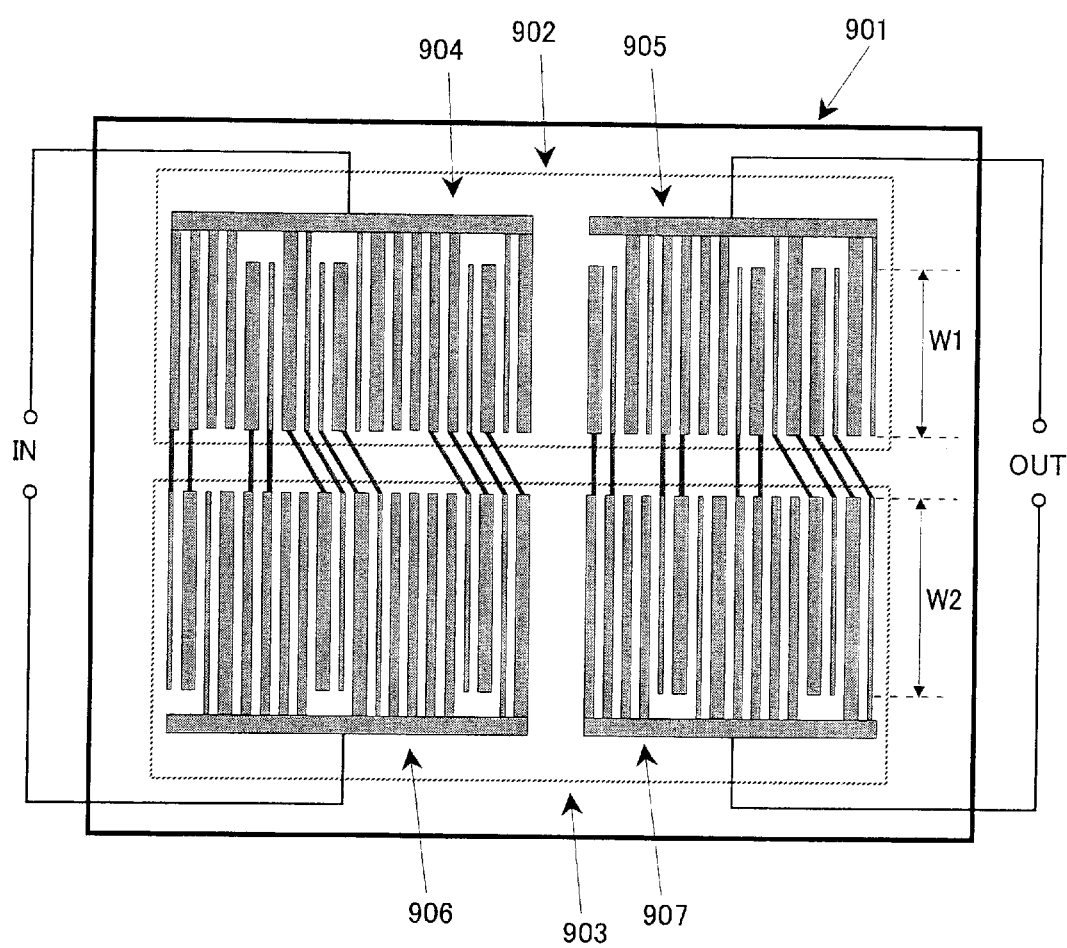
FIG. 9 is a construction view of a surface acoustic wave filter of another embodiment in the present invention.
Figure 10:
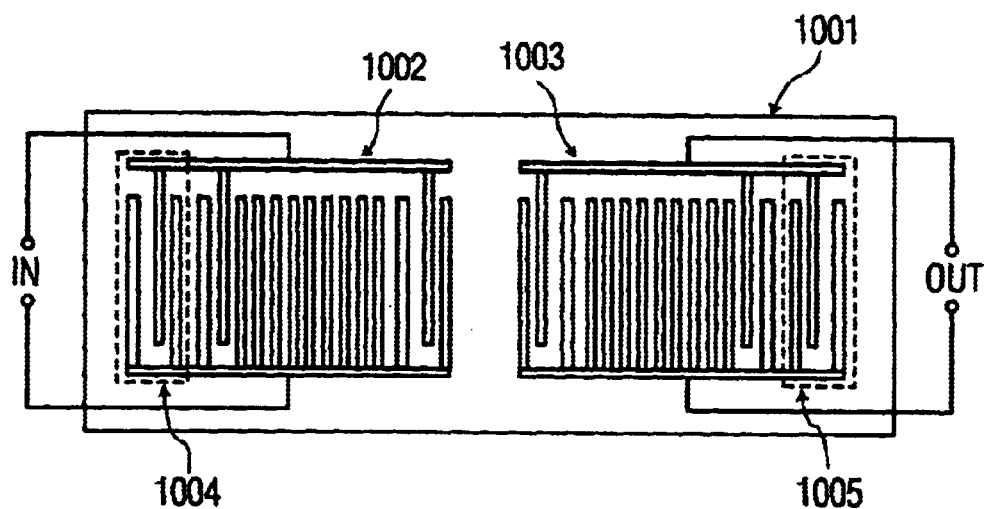
FIG. 10(*a*) is a construction view of a conventional surface acoustic wave filter.
Figure 10:
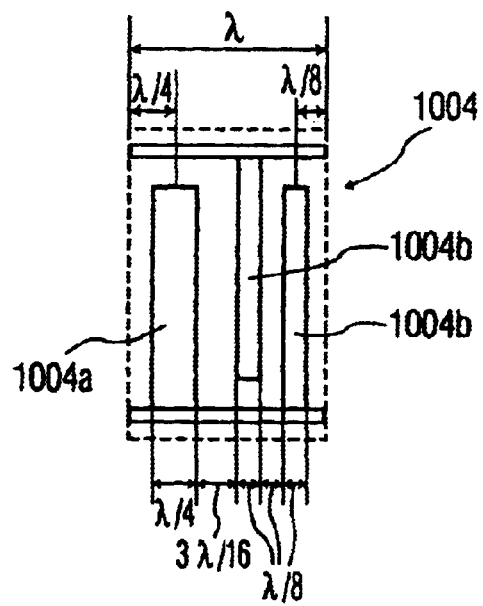
Figure 11:
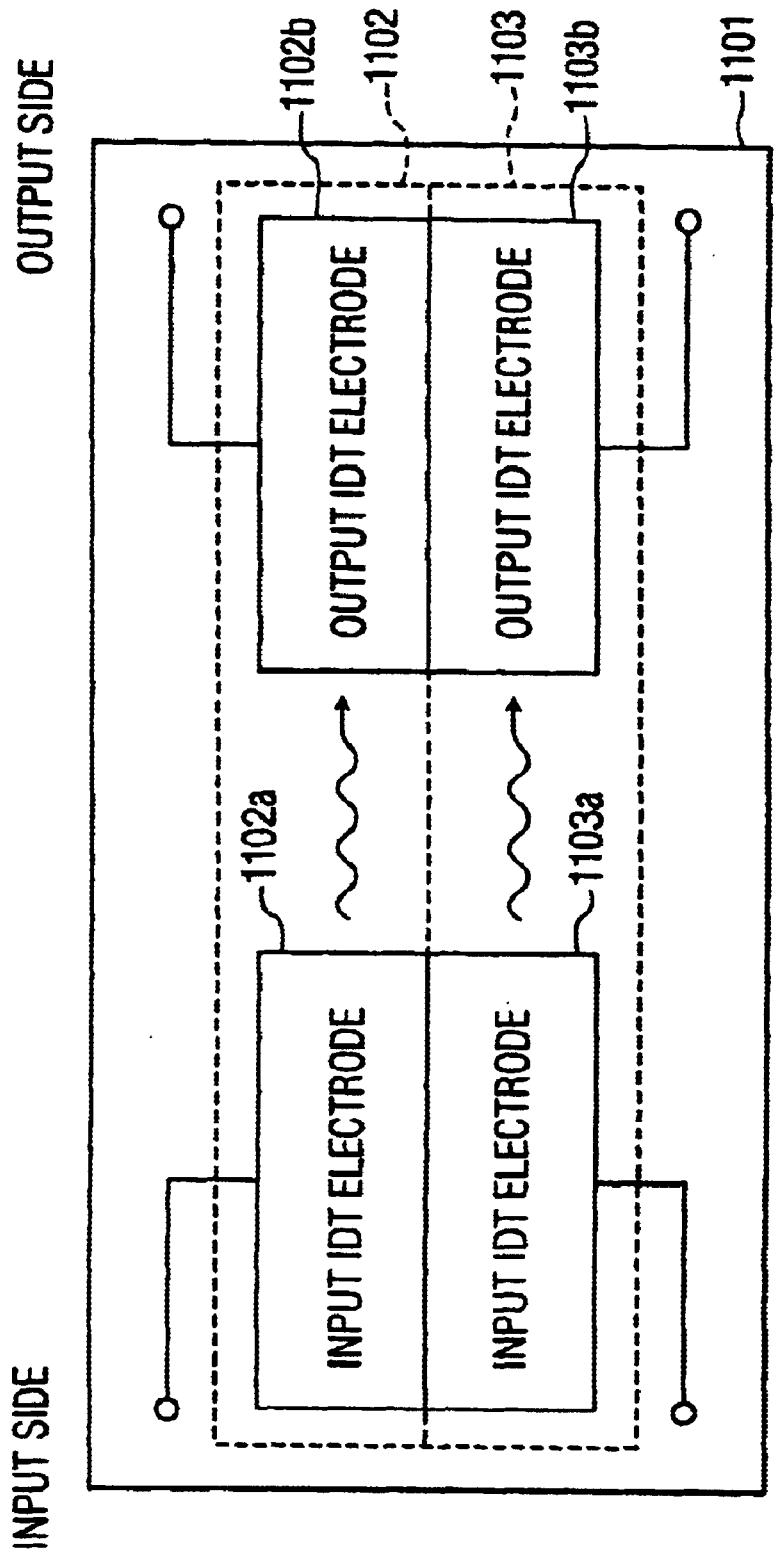
FIG. 11 is a construction view of a surface acoustic wave filter having a conventional two-channel filter.

In addition, in the above described embodiment, the first filter track 502 and the second filter track 503 are brought into connection in parallel via the bus bar electrodes 504b and 506a in the input side and via the bus bar electrodes 505b and 507a in the output side. As shown in FIG. 9, however, if on the piezoelectric substrate 901, for an input IDT electrode 904 of the first filter track 902 and an input IDT electrode 906 of the second filter track 903, and for an output IDT electrode 905 of the first filter track 902 and an output IDT electrode 907 of the second filter track 903, the bus bar electrodes facing each other between the first filter track 902 and the second filter track 903 are omitted and respective electrode fingers of the IDT electrodes are connected to each other, a similar effect can be provided.

Moreover, the length in the direction of the overlapping width can be made shorter, and a further compact surface acoustic wave filter can be realized.

In addition, in the construction example in FIG. 9, the portion of resistant losses due to the bus bar electrode 504b, 506a, 505b and 507a as shown in FIG. 5 will be reduced so that surface acoustic wave filter with lower insertion loss can be provided. This case as well is similar to that in FIG. 5 on the point that the overlapping width W1 of the first filter track 902 and the overlapping width W2 of the second filter track 903 are set to different lengths, and quantity of the amplitude characteristics are adjusted, and flatness within the passband can be realized.

Incidentally, in the case where the characteristics of the first filter track and the second filter track are opposite each other, the above described W1/W2 relationships will become opposite likewise.

As described above, according to the surface acoustic wave filter of the present embodiment, compared with the first embodiment, the IDT electrode length will be able to be made further shorter, and it will become possible to enhance compactness on sizes of a surface acoustic wave filter much more. Moreover, the surface acoustic wave filter of the present embodiment has a wide pass band, secures a steep attenuation amount outside the passband, and can realize flatness within the passband.

In addition, the surface acoustic wave filter of the present embodiment can have an input/output impedance lower than that of the surface acoustic wave filter in which EWC-SPUDT described in-the first and the second embodiments is used, and moreover, can take impedance matching with devices brought into connection with the previous stage and the poststage of the surface acoustic wave filter much easier. Mounting the surface acoustic wave filter of the present invention onto a communication apparatus having transmission means and reception means can provide a communication apparatus with higher performance.

Incidentally, the present embodiment has been described to be designed to have the overlapping width of the first filter track being shorter than the overlapping width of the second filter track, but this depends on pass characteristic of the filter in its entirety. That is, the size of the overlapping width of each track shall be determined depending on transmitting characteristic of each track, and will not be limited to the size shown in the present embodiment, and the amplitude characteristics of the first and the second filter tracks within the passband are adjusted so that frequencies of values lower by 3 dB from the maximum attenuation amount of respective filter tracks are made to be approximately the same, thereby making flat and wide passband realizable, which effect is likewise.

That is, the present embodiment has been described to give the relationship between α and β in terms of h/λ being approximately 1.8% as well as in terms of L2/L1=1.75, but h/λ may be another film thickness ratio or even if L2/L1 is other than 1.75, and preferably, if L2/L1 falls within the range of 1.4 to 3.6 and if α<β is fulfilled, an effect similar to that of the present invention is given.

In addition, the present invention will not be limited hereto with respect to connection of the first and the second filter tracks, and if the first and the second filter tracks are brought into connection in parallel each other and the overlapping width of each filter track is different, quantity of the amplitude characteristics of the first and the second filter tracks within the passband are adjusted, and flatness within the passband can be realized, giving rise to an effect similar to that of the present invention.

Incidentally, in the first to third embodiments, the unidirectional electrode within the regions 401, 403, 601 and 603 are equivalent to the first unidirectional electrode of the present invention and the unidirectional electrode of the regions 402 and 602 are equivalent to the second unidirectional electrode of the present invention. However, the first unidirectional electrode of the present invention may be realized as a unidirectional electrode of the regions 402 and 602. At this time, the second unidirectional electrode of the present invention is realized as the unidirectional electrode within the regions 401, 403, 601 and 603.

Incidentally, the first to third embodiments were described by involving a unidirectional electrode for the IDT electrodes constructing the first and the second filter tracks, but beside this, a construction in combination of bilateral electrodes with λ/8 electrode width or bilateral electrodes with λ/4 electrode width in general use conventionally may be used so as to give rise to a similar effect in terms of low insertion loss.

Incidentally, such a combination will not be limited hereto, but shall be determined with a weighting function forgiving desired filter characteristics. In addition, in the present embodiment, disposition of the unidirectional electrode constructing the first as well as the second filter tracks shall be defined by a weighting function for giving desired filter characteristics and will not be limited hereto.

In addition, the first to the third embodiments were described with two filter tracks, one being the first and the other being the second, but besides this, a surface acoustic wave filter with three or more filter tracks can give rise to a similar effect. Incidentally, in this case, the weighting functions for respective filter tracks will be different from each other, but the point that the overlapping width of each filter track is changed so that quantity of the amplitude characteristics of each filter track within the passband are adjusted, and flatness within the passband can be realized is the same as in the first to the third embodiments.

Moreover, the unidirectional electrode of the present invention may be used in the surface acoustic wave filter having a single filter track and comprising one input IDT electrode and output IDT electrode respectively so as to give rise to a similar effect in terms of low insertion loss.

Incidentally, the embodiment of the present invention was described with 37° rotating Y cut quartz substrate as the piezoelectric substrate, but besides this, other cut angles will do, and shall be selected so as to give an optimum temperature characteristics with film thickness, metalization ratio and working temperature range for an electrode. In particular, 28° to 42° is preferable. In addition, as the piezoelectric substrate, other piezoelectric substrates such as $LiTaO_3$ and $Li_2B_4O_7$ will give rise to a similar effect.

In addition, in the above described respective embodiments, the both of the input/output IDT electrodes were supposed to include the unidirectional electrodes, but besides this, a construction with either one of the input or output IDT electrodes includes the unidirectional electrode will work as well.

As obvious from what has been described above, according to the present invention, a surface acoustic wave filter being compact, having wide passband and having steep attenuation characteristics in the vicinity of passband as well as a flat characteristics within the passband can be provided.

What is claimed is:

1. A surface acoustic wave filter, comprising:

a piezoelectric substrate; and at least a first and a second filter track each having at least an input interdigital transducer electrode and an output interdigital transducer electrode provided on said piezoelectric substrate, wherein the respective input interdigital transducer electrodes of said first and second filter tracks are connected in parallel;

the respective output interdigital transducer electrodes of said first and second filter tracks are connected in parallel, overlapping widths of electrode fingers of said input interdigital transducer electrode and output interdigital transducer electrode are different from each other for each of said at least two filter tracks, and the first filter track differs from the second filter track in the number of peaks.

2. The surface acoustic wave filter according to claim 1, wherein said filter tracks are two filter tracks of a first filter track and a second filter track, the input interdigital transducer electrodes of said first and second filter tracks are brought into connection in parallel, the output interdigital transducer electrodes of said first and second filter tracks are brought into connection in parallel, and overlapping width of the electrode fingers of the said input interdigital transducer electrode and output interdigital transducer electrode in said first filter track and overlapping width of the electrode fingers of the said input interdigital transducer electrode and output interdigital transducer electrode in said second filter track are different from each other.

3. The surface acoustic wave filter according to claim 2, wherein said first filter track and said second filter track have different weighting functions.

4. The surface acoustic wave filter according to claim 2 or 3, wherein a phase relationship between said first filter track and said second filter track is substantially in-phase within a passband, and is substantially in opposite phase outside the passband, and center frequencies of said first and second filter tracks are substantially the same.

5. The surface acoustic wave filter according to claim 4, wherein said first filter track has a transmission characteristic of having two peaks within the passband, said second filter track has a transmission characteristic of having one peak within the passband; and an amplitude characteristic of said first filter track and said second filter track is that frequencies of values lower by substantially 3 dB than a value of a maximum attenuation amount are substantially the same.

6. The surface acoustic wave filter according to claim 5, wherein with the overlapping width of said first filter track being W1 and the overlapping width of said second filter track being W2, a relationship of $0.8 \leq W1/W2 \leq 0.95$ is fulfilled.

7. The surface acoustic wave filter according to any of claims 1 to 3, wherein at least one of said input interdigital transducer electrode and/or output interdigital transducer electrode of at least one of the filter tracks includes a unidirectional electrode.

8. The surface acoustic wave filter according to claim 7, wherein said unidirectional electrode includes two kinds, that is, a first unidirectional electrode to intensify surface acoustic waves in a predetermined direction and a second unidirectional electrode to intensify surface acoustic waves in the direction opposite to said predetermined direction.

9. The surface acoustic wave filter according to any of claims 1 to 3, wherein parallel connection of said input interdigital transducer electrodes of said filter tracks is configured by connecting adjacent electrode fingers with each other, and parallel connection of said output interdigital transducer electrodes of said filter tracks is configured by connecting adjacent electrode fingers with each other.

10. The surface acoustic wave filter of claim 1 including, at least one of said first and second filter tracks having an input interdigital transducer electrode and an output interdigital transducer electrode provided on said piezoelectric substrate, wherein said input interdigital transducer electrode and/or said output interdigital transducer electrode include a first unidirectional electrode to intensify surface acoustic waves in one direction and a second unidirectional electrode to intensify surface acoustic waves in the direction opposite to said one direction.

11. The surface acoustic wave filter according to claim 10, wherein said first and second unidirectional electrodes have four electrode fingers in one wavelength, said four electrode fingers have two electrode finger pairs, and said electrode finger pairs have electrode fingers having different widths, and an electrode width ratio (L2/L1) between a width (L2) of thick electrode finger and width (L1) of thin electrode finger is larger than 1.

12. The surface acoustic wave filter according to claim 11, wherein, in said electrode finger pair, with a distance between said thin electrode finger and said thick electrode finger being $\gamma$;

with a distance between said thin electrode finger and the left end of a region covering said input interdigital transducer electrode and/or said output interdigital transducer electrode sectioned by a half-wavelength unit being $\alpha$; and with a distance between said thick electrode finger and the right end of a region covering said input interdigital transducer electrode and/or said output interdigital transducer electrode sectioned by a half-wavelength unit being $\beta$, relationships of $\gamma > \alpha + \beta$ and $\alpha < \beta$ are given.

13. The surface acoustic wave filter according to claim 12, wherein said electrode width ratio (L2/L1) in said electrode finger pair falls within a range of $1.4 \leq (L2/L1) \leq 3.6$.

14. The surface acoustic wave filter according to claim 11, wherein positions of said thin electrode finger and said thick electrode finger of said first unidirectional electrode are opposite from positions of said thin electrode finger and said thick electrode finger of said second unidirectional electrode.

15. The surface acoustic wave filter according to any one of claims 1, 2, 3 or 10, wherein said piezoelectric substrate is 28° to 42° rotating Y cut quartz substrate.

16. A communication apparatus, comprising:

the surface acoustic wave filter according to any one of claims 1, 2, 3, 10 to 14; transmission means of carrying out transmission; and reception means of carrying out reception.

17. The surface acoustic wave filter of claim 1 including:

said first filter track having at least one peak in the frequency response and said second filter track having at least one peak in the frequency response and a number of peaks of said first filter track is different from a number of peaks of said second filter track, the at least one peak of the first filter track having substantially the same attenuation as the at least one peak of the second filter track.

* * * * *

UNITED STATES PATENT AND TRADEMARK OFFICE
CERTIFICATE OF CORRECTION

PATENT NO. : 6,650,206 B2
DATED : November 18, 2003
INVENTOR(S) : Hiroyuki Nakamura et al.

It is certified that error appears in the above-identified patent and that said Letters Patent is hereby corrected as shown below:

<u>Title page,</u>
Item [57], ABSTRACT,
Line 3, before the word "at" delete -- a --

Signed and Sealed this

Thirtieth Day of March, 2004

JON W. DUDAS
*Acting Director of the United States Patent and Trademark Office*